United States Patent [19]

Nakayama et al.

[11] Patent Number: 4,581,541
[45] Date of Patent: Apr. 8, 1986

[54] SWITCH DEVICE EQUIPPED WITH MUTING FUNCTION

[75] Inventors: Koichi Nakayama, Saitama; Yoshito Tanaka, Kawagoe, both of Japan

[73] Assignee: Toko, Inc., Tokyo, Japan

[21] Appl. No.: 670,057

[22] Filed: Nov. 9, 1984

[30] Foreign Application Priority Data

Nov. 15, 1983 [JP] Japan ................................ 58-214858

[51] Int. Cl.⁴ ...................... H03K 17/56; H03K 17/60
[52] U.S. Cl. .................................... 307/243; 307/350; 307/254
[58] Field of Search .............................. 307/239–244, 307/254; 361/75; 84/1.01, 1.26

[56] References Cited

U.S. PATENT DOCUMENTS 3,089,091  5/1963  Lindenthal ........................ 307/243
3,233,121  2/1966  Chou ................................ 307/243
3,519,723  7/1970  Wiest ............................... 84/1.01

Primary Examiner—Stanley D. Miller
Assistant Examiner—B. P. Davis

[57] ABSTRACT

In a switch device comprising a plurality of analog switches for switchingly selecting a desired signal out of a plurality of input signals, means is provided for preventing pop noise from occurring when the switching operation is performed.

5 Claims, 7 Drawing Figures

FIG. I
PRIOR ART

SWITCH DEVICE EQUIPPED WITH MUTING FUNCTION

BACKGROUND OF THE INVENTION

1. Field of the Invention

This invention relates to a switch device arranged to switchingly select a desired signal out of a plurality of input signals by using a plurality of analog switches, and more particularly it pertains to a switch device equipped with muting function for preventing pop noise from occurring during switching operation thereof.

2. Description of the Prior Art

To switchingly select a desired signal out of a plurality of input signals, a switch circuit has heretofore been employed which includes a pluraly of analog switches which typically comprise active elements such as transistors. Each such analog switch has an input terminal, an output terminal and a control terminal, and arranged to be turned on in response to a control signal supplied from a control circuit to the control terminal thereof so that an input signal applied to the input terminal is permitted to appear at the output terminal.

In the conventional switch circuit, the analog switches have their output terminals connected together to constitute a common output terminal, and when the control signal is selectively supplied to the control terminal of one of the analog switches while input signals are being applied to the input terminals of the analog switches, only said one analog switch is turned on in response to the control signal so that the input signal being applied to the input terminal thereof is permitted to pass therethrough to the common output terminal.

In order to switch the above-mentioned state to a state in which another input signal being applied to the input terminal of another analog switch is permitted to appear at the common output terminal, the application of the control singal to the first analog switch is interrupted and thereupon a control signal is now applied to the second analog switch, whereby the first analog switch, which has been in the "on" state, is turned off and the second analog switch is turned on, so that the input signal being applied to the second analog switch is now obtained at the common out terminal.

However, the aforementioned conventional switch circuit is disadvantageous in that when it is switched from the state in which a first input signal is available at the common output terminal through a first analog switch to the state in which a second input signal is available at the common output terminal through a second analog switch, the first input signal is suddenly interrupted while the second input signal is suddenly caused to appear, so that an abrupt potential change is caused which results in pop noise. Moreover, there is the tendency that crosstalk and/or interference is caused between the paths for the first and second input signals.

SUMMARY OF THE INVENTION

Accordingly, it is an object of the present invention to provide a switch device arranged to most effectively prevent pop noise, crosstalk and interference from occurring when switching operation is effected.

Another object of the present invention is to provide a switch device equipped with muting means which is actuated when switching operation is effected.

The switch device according to the present invention comprises a plurality of analog switches, the analog switches having their output terminals connected together, and is arranged such that an input signal applied to the input terminal of a turned-on analog switch is derived at the common output terminal through the turned-on analog switch. The present switch device is provided with muting means which is operative to gradually decrease down to zero the amplitude of a given input signal available at the common output terminal before the switching operation of the switch device is effected; to maintain, for a predetermined period of time, the condition that the amplitude of the signal available at the common output terminal is zero, and to gradually increase the amplitude of another input signal which is to be obtained at the common output terminal after the switching operation is effected.

According to an embodiment of the present invention, each of the analog switches includes means responsive, when the analog switch is turned on, to a change in the DC voltage at the connection point between the output terminals of the respective analog switches, the change being caused by a DC voltage applied to the connection point. That is, each of the analog switches is so designed as to operate to decrease the amplitude of the input signal derived at the common output terminal as the DC voltage at the connection point is increased from the normal operating level to a predetermined voltage level, to make the amplitude zero when the predetermined voltage level is reached, and to increase the amplitude as the DC voltage at the connection point is decreased from the predetermined voltage level down to the normal operating level.

According to another embodiment of the present invention, an emitter-follower circuit is connected to the aforementioned connection point; a common output terminal is led out of the emitter of a transistor consitituting the emitter-follower circuit; and a DC voltage is applied to the emitter to change the emitter DC voltage, thereby enabling the emitter follower circuit to perform an operation similar to that mentioned above.

In either embodiment, the control circuit incorporated in the switch device according to the present invention is arranged to selectively provide, in response to the switching operation of the switch device, a first control signal to the respective analog switches to turn on the selected one of the analog switches, and at the same time provide a second control signal, different from the first control signal, which is applied to the muting means. In response to the second control signal, the muting means generates a DC voltage to change the DC voltage either at the above-mentioned connection point or at the emitter of the transistor constituting the emitter-follower circuit in such a manner that the latter DC voltage is first gradually increased up to a predetermined voltage level, maintained at the predetermined voltage level for a predetermined period of time, and then gradually decreased down to the predetermined voltage level. The control circuit is also arranged to switch the control signal for the respective analog switches within the period of time during which the DC voltage at the aforementioned connection point or the emitter voltage of the transistor constituting the emitter-follower circuit is maintained at the predetermined voltage level. Thus, no output signal is allowed to occur at the common output terminal when switching between the control signals for the respective analog switches is effected; and the output signal available at the common output terminal before the switching between the control signals is effected is caused to fade out while an output signal to which the first output signal is to be changed over after the switching between the control signals is effected, is caused to fade in. In this way, according to the present invention, it is possible to most effectively solve the problems with the aforementioned conventional switch device.

DESCRIPTION OF THE PREFERRED EMBODIMENTS

In order to have a better understanding of the present invention, description will first be made of a conventional switch device with reference to FIGS. 1 and 2.

Figure 1:
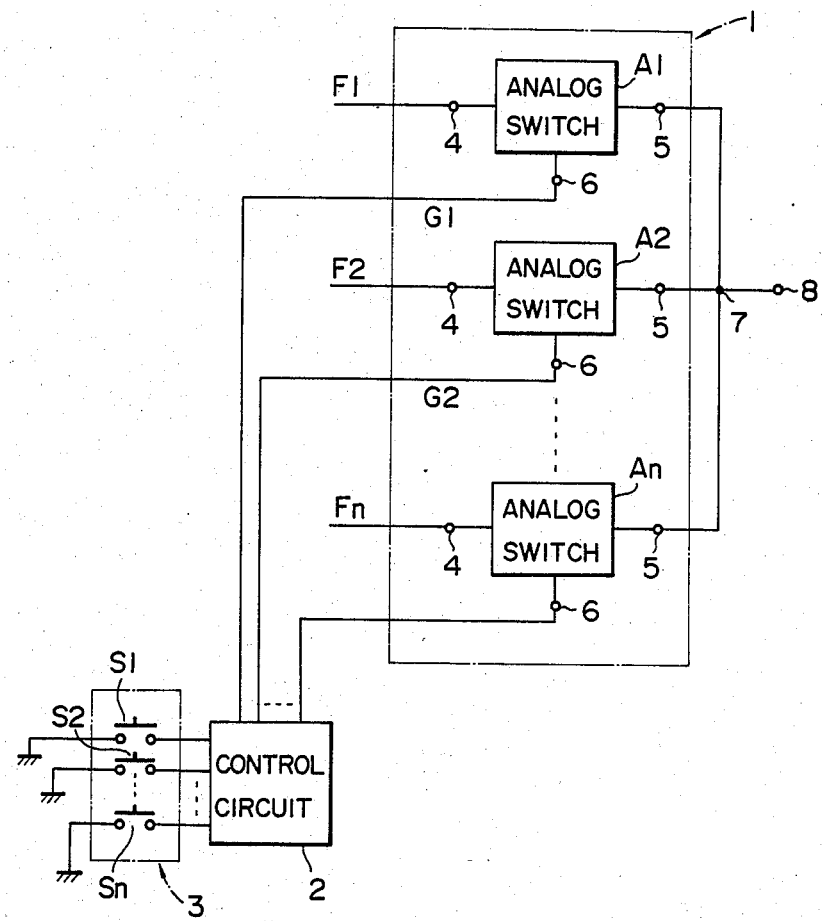
FIG. 1 is a block diagram illustrating the prior-art switch device.

Referring to FIG. 1, there is shown, in a block diagram, the conventional switch device which includes a switch circuit 1 comprising a plurality of analog switches A1, A2, ..., An (where n is a positive integer greater than 2); a control circuit 2 for controlling the analog switches A1, A2, ..., An; and a selector means 3 for selecting one of input signals F1, F2, ..., Fn which are being applied to the analog siwtches A1, A2, ..., An respectively.

Each of the analog switches A1, A2, ..., An which constitute the switch circuit 1 has an input terminal 4, an output terminal 5, and a control terminal 6. Input signals F1 to Fn are applied to the input terminals 4 of the analog switches A1 to An respectively. The analog switches A1 to An have their output terminals 5 connected together at a connection point 7 from which a common output terminal 8 is led out. A control signal available from the control circuit 2 is selectively supplied to the control terminals 6 of the analog switches A1 to An so that only the analog switch which is supplied with the control signal at the control terminal 6 thereof is turned on so as to permit the input signal being applied to the input terminal 4 thereof to be passed therethrough to the common output terminal 8.

The analog switch selector means 3 comprises a plurality of input signal selecting manual switches S1, S2, ..., Sn. It is also possible that the selector means 3 may comprise transistors in lieu of the manual switches. Upon actuation of one of these manual switches S1 to Sn, the corresponding analog switch is turned on by the control signal supplied from the control circuit 2, while the analog switch has so far been turned on, is turned off; thus, the input signal being applied to the newly turned-on analog switch is permitted to appear at the common output terminal 8.

Figure 2:
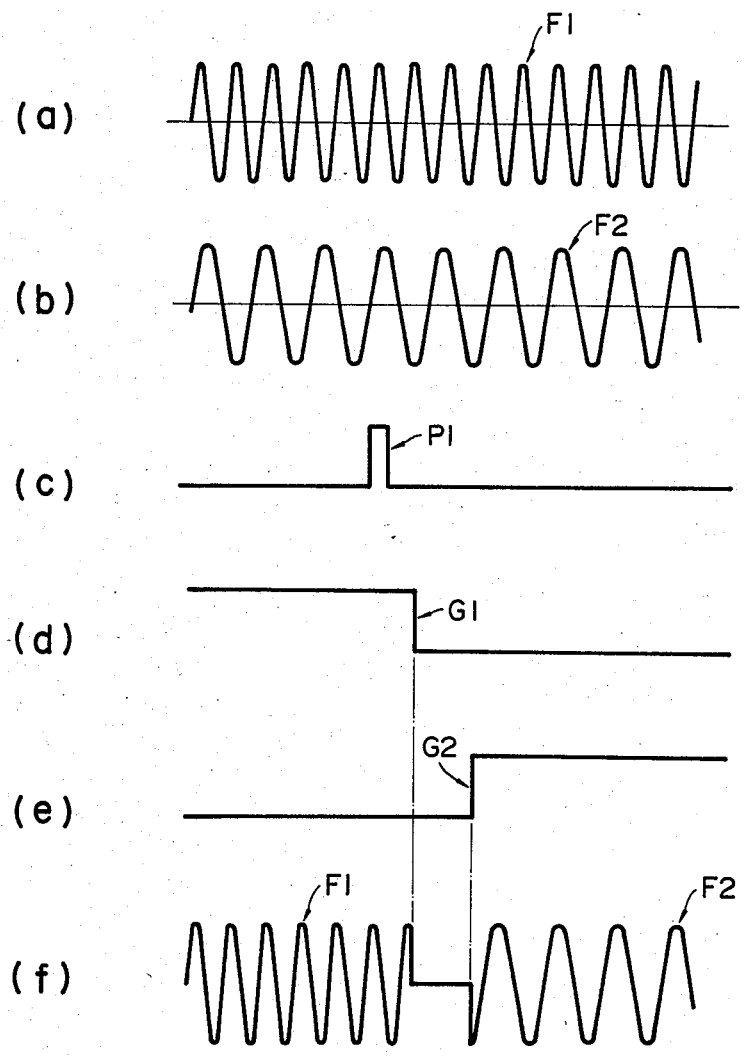
FIG. 2 is a view showing waveforms which occur at various points in the device shown in FIG. 1.

FIG. 2 illustrates signal waveforms useful for explaining the operation of the circuit shown in FIG. 1.

Let it be assumed that an AC input signal F1 such as shown at (a) in FIG. 2 is being applied to the input terminal 4 of the analog switch A1 and that an AC input signal F2 such as shown at (b) in FIG. 2 is being applied to the input terminal 4 of the analog switch A2. Also let it be assumed that the analog switch A1 is in "on" state because of the control signal G1 being supplied from the control circuit 2 to the control terminal 6 of the analog switch A1 by virtue of the fact that the switch S1 of the selector means 3 was actuated beforehand, so that the input signal F1 is being outputted at the common output terminal 8 through the analog switch A1.

Under the aforementioned condition, if the switch S2 of the selector means 3 is actuated in order that the input signal to be outputted at the common output terminal 8 may be switched from F1 to F2, then a changeover pulse P1 such as shown at (c) in FIG. 2 will be generated in the control circuit 2, and as a result the control signal G1 being supplied from the control circuit 2 to the control terminal 6 of the analog switch A1 will become nil as shown at (d) in FIG. 2; thus, the analog switch A1 will be turned off. At the same time, the control circuit 2 will provide, in place of the control signal G1, a control signal G2 such as shown at (e) in FIG. 2 which will in turn be applied to the control terminal 6 of the analog switch A2 so that the latter will thereby be turned on. In this way, the input signal F2, in place of F1, will be outputted at the common output terminal 8. In this case, as will be seen from FIG. 2(f), the input signal waveform will be abruptly changed from F1 to F2, and such adrupt change will cause generation of pop noise.

Figure 3:
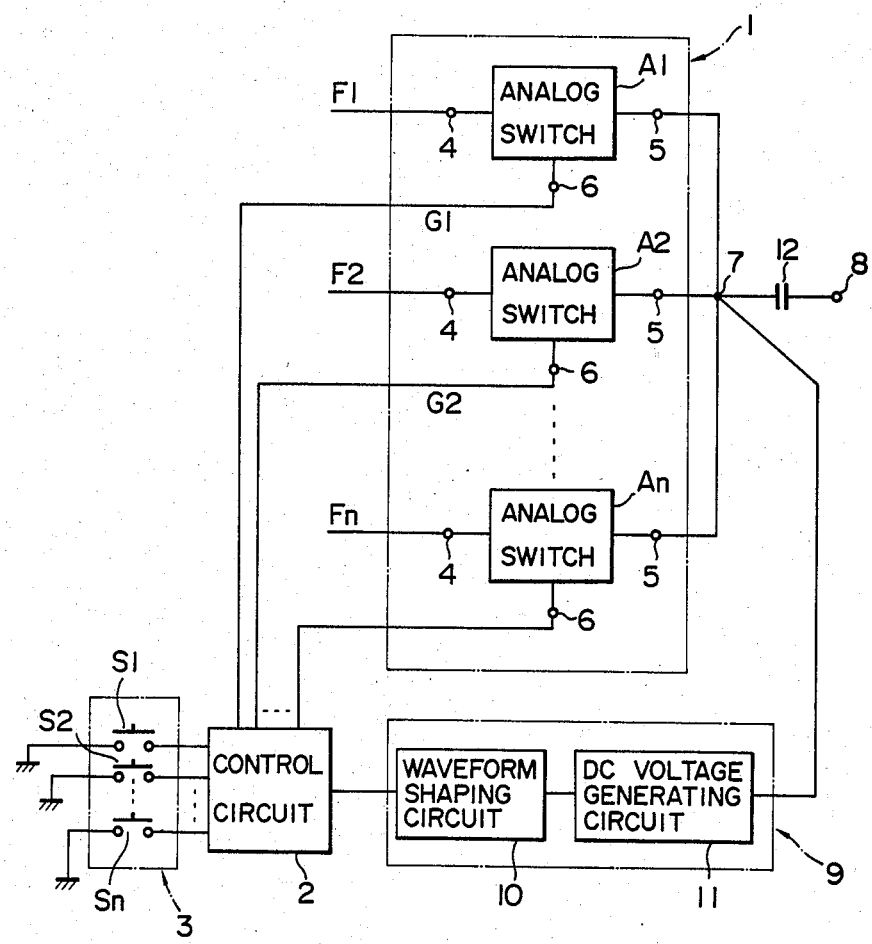
FIG. 3 is a block diagram illustrating the switch device according to a first embodiment of the present invention.

Referring to FIG. 3, there is shown, in a block diagram, the switch device equipped with muting function according to a first embodiment of the present invention. In FIG. 3, just for the sake of convenience, parts corresponding to those of FIGS. 1 are indicated by like reference numerals. The switch device shown in FIG. 3 is similar to the conventional switch device shown in FIG. 1 in that it includes a switch circuit 1 comprising a plurality of analog switches A1 to An, a control circuit 2 for controlling the plurality of analog switches, and a selector means 3 for selecting one of input signals which are being inputted to the analog switches A1 to An respectively. It is to be particularly noted, however, that the switch device according to this embodiment of the present invention further includes a muting signal generating circuit 9 which comprises a waveform shaping circuit 10 to which is applied the control signal from the circuit 2 when the selector means 3 is actuated, and a DC voltage generating circuit 11 for applying a DC voltage to the connection point 7. A capacitor 12 is connected between the connection point 7 and the common output terminal 8.

Description will now be made of the operation of the circuit shown in FIG. 3, with reference to the waveforms shown in FIG. 4.

Figure 4:
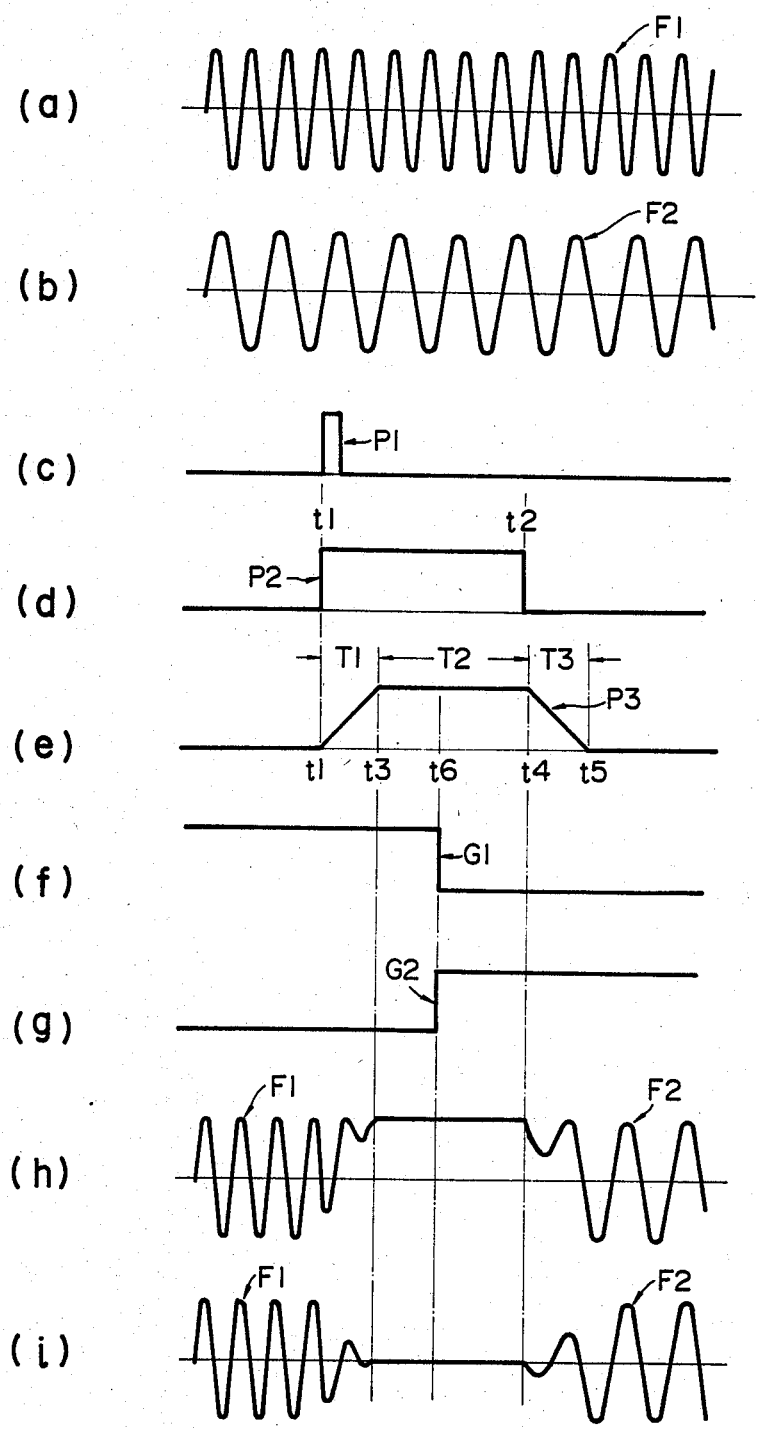
FIG. 4 is a view showing waveforms which occur at various points in the embodiment shown in FIG. 3.

Let it be assumed that an AC input signal F1 such as shown at (a) in FIG. 4 is being applied to the input terminal 4 of the analog switch A1 and that an AC input signal F2 such as shown at (b) in FIG. 4 is being applied to the input terminal 4 of the analog switch A2. Also let it be assumed that the analog switch A1 is in "on" state because of a control signal G1 being supplied from the control circuit 2 to the control terminal of the analog switch A1 by virtue of the fact that the switch S1 of the selector means 3 was actuated beforehand, so that the signal F1 is being outputted at the common output terminal 8 through the analog switch A1.

Under such a condition, if the switch S2 of the selector means 3 is actuated at a time point t1 to switch the output signal available at the common output terminal 8 from F1 to F2, then a switching pulse P1 such as shown at (c) in FIG. 4 will be generated in the control circuit 2; thereupon the control circuit 2 will be caused to generate a control signal P2 having a duration corresponding to the time period from the time point t1 to a time point t2 such as shown at (d) in FIG. 4; and the control signal P2 will in turn be applied to the waveform shaping circuit 10 of the muting signal generating circuit 9. The control circuit 2 may be constituted by logic circuits such as, for example, I$^2$L circuits (integrated injection logic circuits) or the like.

The waveform shaping circuit 10, which may comprise a time-constant circuit or an integrator circuit, is arranged to convert the pulse waveform P2 to a pulse waveform P3 such as shown at (e) in FIG. 4. As will be appreciated from FIG. 4, the singal P3 gradually builds up from the time point t1 with a relatively long rise time T1, has a constant voltage level for the time period, indicated by T2, between time points t3 and t4, and gradually falls with a relatively long fall time T3 during the time period from the time point t4 to a time point t5. When the signal P3 is applied to the DC signal generating circuit 11, the latter provides a DC voltage which changes in a fashion similar to that of the signal P3 and has a constant voltage level V during the time period T2 from the time point t3 to the time point t4, and such a DC voltage is applied to the connection point 7.

Each of the analog switches A1 to An is arranged as follows: Even when the control signal is being supplied from the control circuit 2 to any of the control terminals 6 of the analog switches A1 to An, the amplitude of the signal outputted at the common output terminal 8 via the connection point 7 is gradually decreased as the DC voltage at the connection point 7 is increased from the normal operating level; when a predetermined voltage level V higher than the normal operating level is established at the connection point 7, the amplitude of the output signal available at the common output terminal 8 becomes zero; and as the DC voltage at the connection point 7 is gradually decreased from the predetermined voltage level V, the amplitude of the output signal obtained at the common output terminal 8 is gradually increased from zero.

In response to the switching pulse P1 such as shown at (c) in FIG. 4 which is applied from the selector means 3, the control circuit 2 operates to extinguish the control signal G1 at a time point t6 later than the time point point t1 and instead provides a control signal G2, at the time point t6, which is applied to the control terminal 6 of the analog switch A2. It is to be particularly noted that the time point t6 when the control signal G1 is switched to the control signal G2 is selected to be within the time period T2 between the time points t3 and t4. That is, the time point t6 is selected to be within the time period during which no output signal is available at the common output terminal 8 because of the DC voltage at the connection point 7 being maintained at the predetermined voltage level V.

By selecting the time point t6 as mentioned above, the voltage waveform occurring at the connection point 7 is made to appear as shown at (h) in FIG. 4, and consequently the signal waveform available at the common output terminal 8 turns out to be one the amplitude of which is zero during the time period T2 as shown at (i) in FIG. 4.

Figure 5:
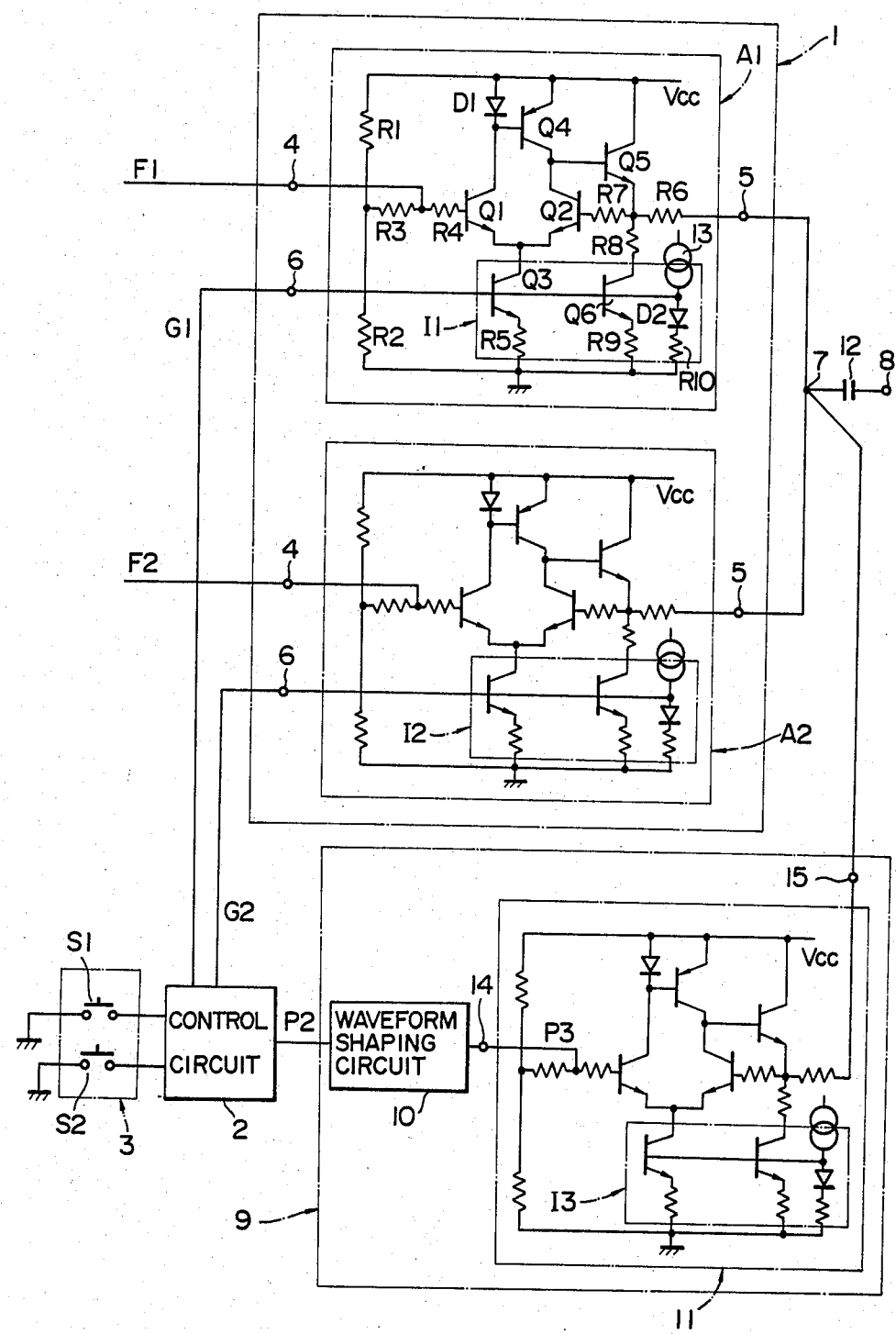
FIG. 5 is a circuit diagram of the switch circuit and DC voltage generating circuit incorporated in the switch device shown in FIG. 3.

Referring to FIG. 5, there are shown, in circuit diagram, an example of the switch circuit 1 which comprises two analog switches A1 and A2, and an example of the DC signal generating circuit 10 which is of substantially the same construction as that of the analog switches A1 and A2.

In the analog switch A1 shown in FIG. 5, transistors Q1 and Q2 have their emitters connected together to constitute a differential pair, and the connection point between the emitters is connected to the collector of a transistor Q3. The transistor Q1 is supplied at the base thereof with a bias voltage from the connection point between resistors R1 and R2 constitituting a bias circuit, through impedance control resistors R3 and R4. The connection point between the resistors R3 and R4 is connected to the input terminal 4 of the analog switch A1. The transistor Q3 has the base thereof connected to the control terminal 6 of the analog switch A1 and the emitter thereof grounded through a resistor R5. A transistor Q4 has the base thereof connected to the collector of the transistor Q1, the collector thereof connected to the collector of the transistor Q2, and the emitter thereof connected to a DC voltage source. Thus, the transistor Q4 constitutes, together with a diode D1 connected between the collector of the transistor Q1 and the DC voltage source, an active load circuit for the transistors Q1 and Q2. A transistor Q5 is connected to form an emitter-follower circuit wherein the base of the transistor Q5 is connected to the connection point between the collectors of the transistors Q2 and Q4; the collector thereof is connected to the DC voltage source; and the emitter thereof is connected to the connection point 7 through a resistor R6 and the output terminal 5 of the analog switch A1. The emitter of the transistor Q5 is also connected to the base of the transistor Q2 through a resistor R7 and to the collector of a transistor Q6 through a resistor R8. The transistor Q6 has the base thereof connected to the control terminal 6 of the analog switch A1 and the emitter thereof grounded through a resistor R9. The bases of the transistors Q3 and Q6 are connected to a current source 13 and also grounded through a diode D2 and resistor R10. A current source circuit I1 is constituted by the current source 13, transistors Q3 and Q6, diode D2 and resistor R10.

With the foregoing arrangement, if the control signal is applied from the control circuit 2 to the control terminal 6 of the analog switch A1 while the input signal F1 is being applied to the input terminal 4 of the analog switch A1, then the current source circuit I1 will be activated so that the analog switch A1 will be turned on; thus, the input signal A1 being applied to the input terminal 4 of the analog switch A1 will be derived at the common output terminal 8 from the emitter-follower constituted by the transistor Q5. If the application of the control signal to the control terminal 6 of the analog switch A1 is interrupted, then the current source circuit I1 will be de-activated so that the analog switch A1 will be turned off.

Consider a condition that analog switch A1 is in "on" state because of the control signal being applied to the control terminal 6 thereof and thus the signal F1 is being outputted at the common output terminal 8. Under such a condition, if the DC voltage at the connection point 7 is gradually increased, then the amplitude of the signal F1 at the connection point 7 will be gradually decreased, and when the DC voltage at the connection point 7 becomes equal to the supply voltage Vcc, the transistor Q5 will be rendered non-conductive so that the signal F1 will no longer appear at the connection point 7. It will be readily appreciated that if the DC voltage at the connection point 7 is gradually decreased from the supply voltage Vcc, the signal F1 will appear at the connection point 7 with a gradually increasing amplitude.

As will be seen from FIG. 5, the DC voltage generating circuit 11 of the muting signal generating circuit 9 is similar in construction to the analog switches A1 and A2 except that it is provided with no control terminal and a current source circuit I3 contained therein is activated all the time. Obviously, this facilitates fabrication of the present circuit arrangement in the form of an integrated circuit. A signal P3 such as shown at (e) in FIG. 4, which is available from the waveform shaping circuit 10, is applied to an input terminal 14 led out of the connection point between resistors R3 and R4. An output terminal 15 is connected to the connection point 7. With such an arrangement, the application of the signal P3 to the input terminal 14 will result in a DC voltage being applied to the connection point 7, the DC voltage which is changed in such a manner that it is gradually increased up to the level of the supply voltage Vcc until the time point t3 is reached; it is maintained at the level of the supply voltage Vcc during the time period T2 between the time points t3 and t4; and it is gradually decreased during the time period between the time points t4 and t5. When the control signal is changed from G1 to G2 at the time point t6 within the time period T2, the voltage at the connection 7 will be changed as shown at (h) in FIG. 4, and thus a signal such as shown at (i) in FIG. 4 will be obtained at the common output terminal 8.

Figure 6:
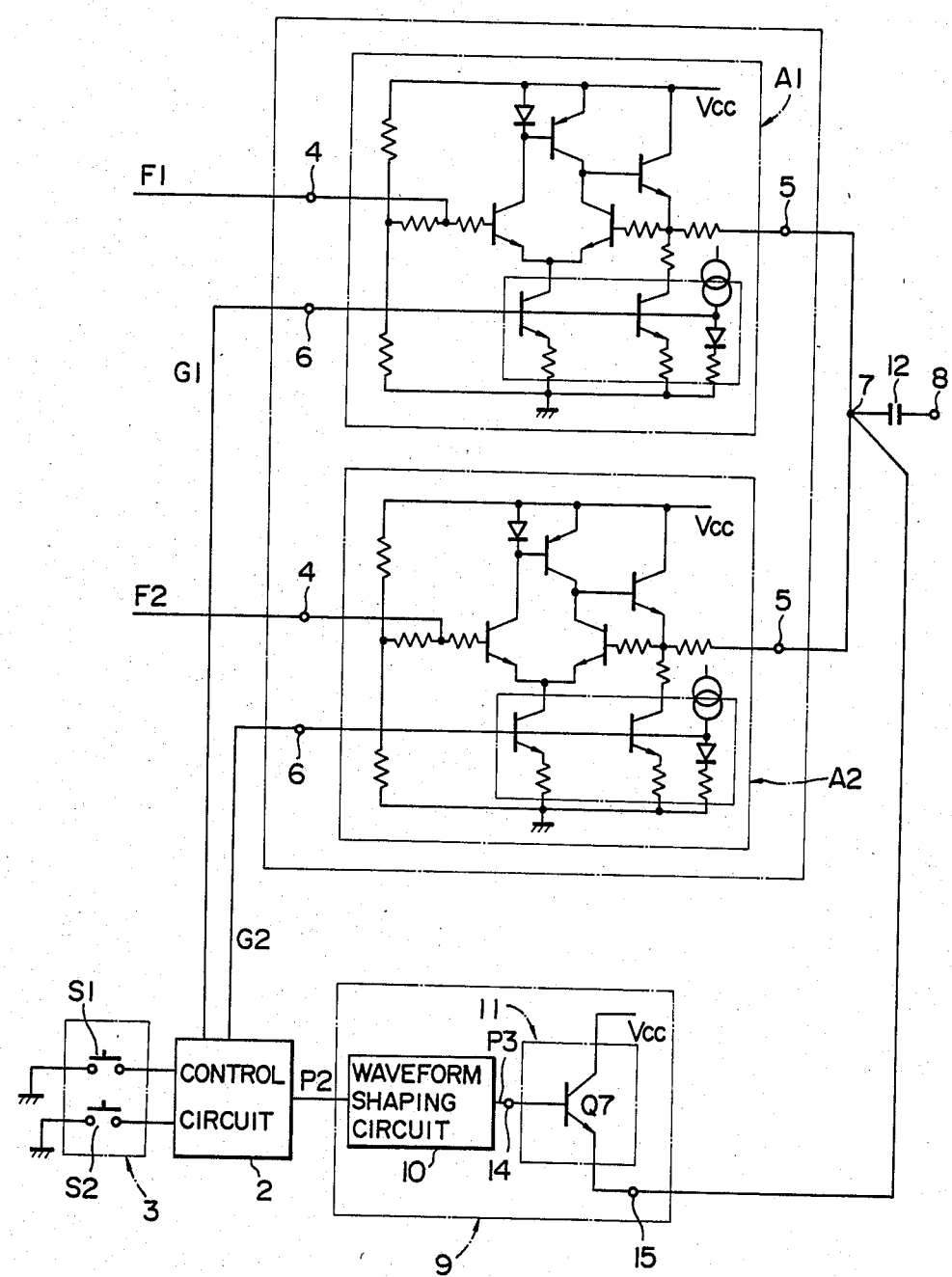
FIG. 6 is a circuit diagram similar to FIG. 5 except that the DC voltage circuit is modified.

Although, in the foregoing embodiment, the DC voltage generating circuit 11 of the muting signal generating circuit 9 was constituted by an analog switch which is similar in construction to the analog switches A1 and A2, it is also possible that the DC voltage generating circuit 11 may be substituted with a single transistor Q7 as shown in FIG. 6, for example. In FIG. 6, the base of the transistor Q7 is connected to the waveform shaping circuit 10 and supplied with the signal P3; the collector thereof is supplied with the supply voltage Vcc; and the emitter thereof is connected to the connection point 7. The analog switches A1 and A2 may be similar in construction to those of FIG. 5, and therefore further description thereof will be omitted. It will readily be appreciated that an effect similar to that of the arrangement shown in FIG. 5 can be obtained by the switch device constructed as shown in FIG. 6.

Figure 7:
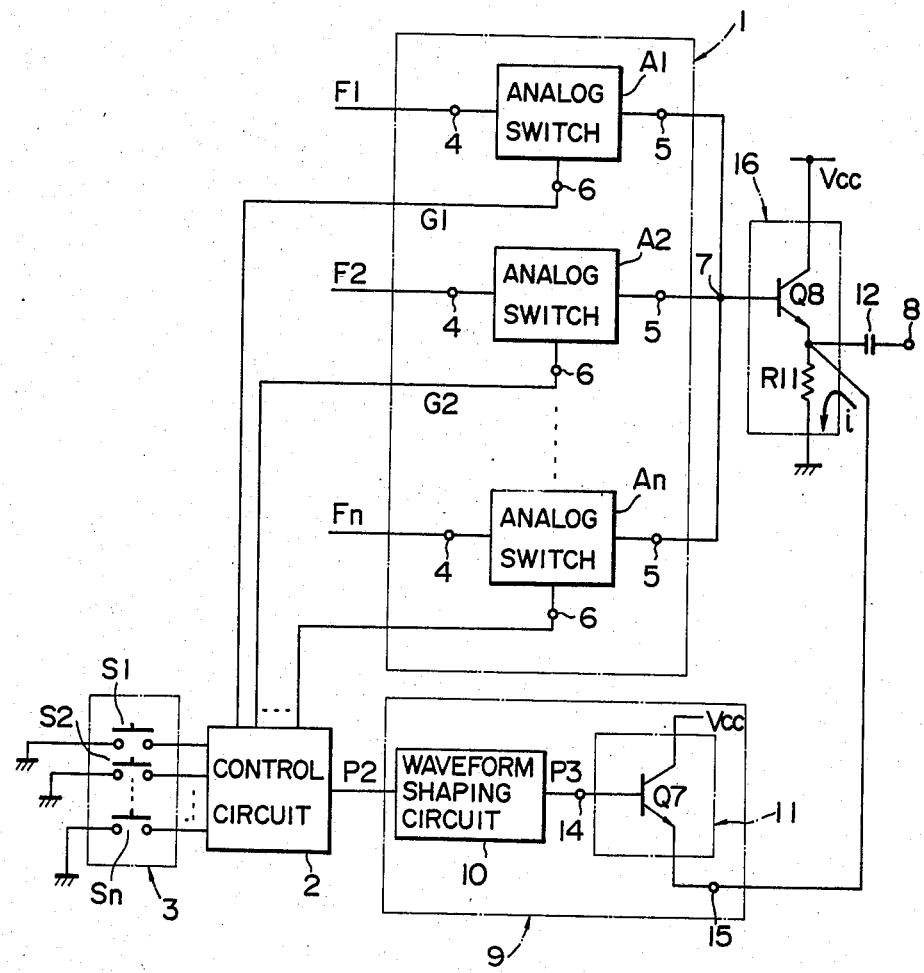
FIG. 7 is a block diagram illustrating the switch device according to a second embodiment of the present invention.

Referring to FIG. 7, there is shown, in a block diagram, a second embodiment of the present invention wherein an emitter-follower circuit 16 which comprises a transistor Q8 is connected between the connection point 7 and the common output terminal 8. More specifically, according to the second embodiment of the present invention shown in FIG. 7, the base of the transistor Q8 is connected to the connection point 7; the collector thereof is supplied with the supply voltage Vcc; and the emitter thereof is grounded through a resistor R11. Furthermore, common output terminal 8 is led out of the emitter of the transistor Q8, and the emitter of transistor Q7 constituting a DC voltage generating circuit 11 is connected to the connection point 7.

By virtue of the fact that the emitter-follower circuit 16 is connected to the output terminals of the analog switches, control of the output of each analog switch is greatly facilitated. In other words, it become easier to gradually increase and decrease the emitter voltage of the transistor Q8 by flowing a current i through the emitter resistor R11 of the emitter-follower circuit 16.

As will be appreciated from the above discussion, with the present switch device equipped muting function, the DC voltage either at the connection point between the output terminals of the respective analog switches or at the emitter of the emitter-follower circuit connected to the connection point is gradually increased up to a predetermined voltage level; subsequently the predetermined voltage level is maintained for a predetermined period of time during which signal change-over is effected; and after the signal change-over has been effected, the aforementioned DC voltage is grandually decreased; thus, according to the present invention, when two signals are to be switched each other, the amplitudes of the two signals are gradually changed to and from zero before and after the time point when the switching is effected, so that no abrupt change is caused between the two signals, thereby making it possible to avoid generation of pop noise.

While the present invention has been described and illustrated with respect to specific embodiments thereof, it is to be understood that the present invention is by no means limited thereto but encompasses all changes and modifications which will become possible without departing from the spirit and scope of the invention.

We claim:

1. A switch device for switchingly select desired one out of a plurality of input signals which are simultaneously inputted, in response to manipulation of selector means, said switch device including a plurality of analog switches equal in number to said plurality of input signals, and a control circuit for applying a control signal to one of said analog switches which is selected in response to the manipulation of said selector means, each of said analog switches having an input terminal to which corresponding one of said input signals is applied, an output terminal, and a control terminal to which the control signal is supplied from said control circuit, wherein when said control signal is applied to the control terminal of said selected analog switch, the latter is turned on so that the input signal being applied to the input terminal thereof is obtained at the output terminal thereof, characterized in that:

said plurality of analog switches have their output terminals connected together, and a common output terminal is led out of the connection point between said output terminals;

said control circuit includes means responsive to manipulation of said selector means to switch the control signal for turning on the analog switches and at the same time provide a second control signal;

means is provided for generating, in response to said second control signal, a DC voltage to change the DC voltage at said connection point in such a manner that the last-mentioned DC voltage is gradually increased up to a predetermined voltage level, maintained at said predetermined voltage level for a predetermined period of time and then gradually decreased from said predetermined voltage level;

each of said analog switches includes means responsive, when said each analog switch is turned on, to said change in the DC voltage at said connection point to decrease the amplitude of the input signal derived, through the turned-on analog switch, at said connection point, to make substantially zero said amplitude when said predetermined voltage level is reached, and thereafter to increase said amplitude from zero; and said control circuit also includes means for switching the control signals for turning on said analog switches while said DC voltage at said connection point is maintained at said predetermined voltage level.

2. A switch device according to claim 1, wherein a DC voltage blocking capacitor is connected between said connection point and said common output terminal.

3. A switch device according to claim 1, wherein said DC voltage generating means comprises a circuit arrangement substantially the same as that of said analog switches.

4. A switch device for switchingly select desired one out of a plurality of input signals which are simultaneously inputted, in response to manipulation of selector means, said switch device including a plurality of analog switches equal in number to said plurality of input signals, and a control circuit for applying a control signal to one of said analog switches which is selected in response to the manipulation of said selector means, each of said analog switches having an input terminal to which corresponding one of said input signals is applied, an output terminal, and a control terminal to which the control signal is supplied from said control circuit, wherein when said control signal is applied to the control terminal of said selected analog switch, the latter is turned on so that the input signal being applied to the input terminal thereof is obtained at the output terminal thereof, characterized in that:

said plurality of analog switches have their output terminals connected together, the connection point between the output terminals being connected to the base of a transistor of emitter-follower configuration, and a common output terminal is led out of the emitter of said transistor;

said control circuit includes means responsive to manipulation of said selector means to switch the control signal for turning on one of said analog switches and at the same time provide a second control signal;

means is provided for generating a DC voltage to change the emitter voltage of said transistor in such a manner that said emitter voltage is gradually increased up to a predetermined voltage level, maintained at said predetermined voltage level for a predetermined period of time and then gradually decreased from said predetermined voltage level;

said transistor is operative, in response to said change in the emitter voltage thereof, to decrease the amplitude of the input signal outputted at the emitter thereof, to make substantially zero said amplitude when said predetermined voltage level is reached, and then to increase said amplitude from zero; and said control circuit also includes means for switching the control signal for turning on one of said analog switches while the DC voltage at the emitter of said transistor is maintained at said predetermined voltage level.

5. A switch device according to claim 4, wherein a DC voltage blocking capacitor is connected between the emitter of said transistor and said common output terminal.

* * * * *